(12) United States Patent
Kawamura

(10) Patent No.: US 10,611,243 B2
(45) Date of Patent: Apr. 7, 2020

(54) GROUND FAULT DETECTION APPARATUS

(71) Applicant: Yazaki Corporation, Tokyo (JP)

(72) Inventor: Yoshihiro Kawamura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 33 days.

(21) Appl. No.: 16/126,958

(22) Filed: Sep. 10, 2018

(65) Prior Publication Data

US 2019/0100104 A1 Apr. 4, 2019

(30) Foreign Application Priority Data

Oct. 4, 2017 (JP) .................................. 2017-194009

(51) Int. Cl.
| | |
|---|---|
| *B60L 3/00* | (2019.01) |
| *G01R 31/02* | (2006.01) |
| *G01R 31/14* | (2006.01) |
| *G01R 19/165* | (2006.01) |
| *G01R 31/00* | (2006.01) |
| *G01R 27/02* | (2006.01) |

(52) U.S. Cl.
CPC ...... *B60L 3/0069* (2013.01); *G01R 19/16528* (2013.01); *G01R 31/025* (2013.01); *G01R 31/028* (2013.01); *G01R 31/14* (2013.01); *G01R 27/025* (2013.01); *G01R 31/006* (2013.01)

(58) Field of Classification Search
CPC .............................. B60L 3/0069; G01R 31/025
See application file for complete search history.

(56) References Cited

U.S. PATENT DOCUMENTS

| | | | | |
|---|---|---|---|---|
| 5,818,236 A | * | 10/1998 | Sone ..................... | B60L 3/0023 324/509 |
| 2014/0021961 A1 | * | 1/2014 | Yamada ............... | G01R 31/025 324/503 |
| 2015/0293167 A1 | | 10/2015 | Kawamura | |

FOREIGN PATENT DOCUMENTS

JP 2015-206784 A 11/2015

* cited by examiner

*Primary Examiner* — Walter L Lindsay, Jr.
*Assistant Examiner* — Milton Gonzalez
(74) *Attorney, Agent, or Firm* — Kenealy Vaidy LLP

(57) ABSTRACT

A ground fault detection apparatus includes a control unit measuring fully charged voltage of a capacitor, a first switch and a first resistor connecting a positive electrode side of a battery to a positive-electrode-side end of the capacitor, a second switch and a second resistor connecting a negative electrode side of the battery to a negative-electrode-side end of the capacitor, a third switch connecting the positive-electrode-side end to ground, a fourth switch connecting the negative-electrode-side end ground, a positive-electrode-side termination resistor connecting the positive electrode side of the battery to the ground, and a negative-electrode-side termination resistor connecting the negative electrode side to ground. The control unit compares charge voltage of the capacitor measured while the first and fourth switches are turned on with charge voltage of the capacitor measured while the second and third switches are turned on.

3 Claims, 7 Drawing Sheets

GROUND FAULT DETECTION APPARATUS

BACKGROUND

Technical Field

The present invention relates to a ground fault detection apparatus using a flying capacitor.

Related Art

In a vehicle such as a hybrid car, which includes an engine and an electric motor as driving sources, and an electric vehicle, a battery mounted on a vehicle body is charged, and driving power is generated with use of electric energy supplied from the battery. In general, a power supply circuit related to the battery is configured as a high-voltage circuit using as high voltage as 200V or higher, and for ensuring safety, the high-voltage circuit including the battery is in an ungrounded configuration in which the high-voltage circuit is electrically insulated from a vehicle body serving as a reference potential point of a ground.

In the vehicle mounted with the ungrounded high-voltage battery, a ground fault detection apparatus is provided to monitor an insulating (ground fault) state between the vehicle body and a system provided with the high-voltage battery, specifically, a main power supply system ranging from the high-voltage battery to a motor. As the ground fault detection apparatus, one of a type using a capacitor called a flying capacitor is widely used.

FIG. 7 illustrates a circuit example of a conventional ground fault detection apparatus of the flying capacitor type. As illustrated in FIG. 7, a ground fault detection apparatus 400 is connected to an ungrounded high-voltage battery 300 to detect a ground fault of a system provided with the high-voltage battery 300. In this apparatus, insulation resistance between a positive electrode side of the high-voltage battery 300 and a ground is referred to as RLp, and insulation resistance between a negative electrode side and the ground is referred to as RLn.

As illustrated in FIG. 7, the ground fault detection apparatus 400 includes a detection capacitor C1 operated as the flying capacitor. The ground fault detection apparatus 400 also includes four switches S1 to S4 around the detection capacitor C1 to switch a measurement path and control charge/discharge of the detection capacitor C1. The ground fault detection apparatus 400 further includes a switch Sa configured to sample voltage for measurement corresponding to charge voltage of the detection capacitor C1.

To figure out the insulation resistance RLp and RLn, the ground fault detection apparatus 400 repeats a measurement operation with one cycle having V0 measurement period→Vc1$n$ measurement period→V0 measurement period→Vc1$p$ measurement period. In any of the measurement periods, the detection capacitor C1 is charged with voltage to be measured, and charge voltage of the detection capacitor C1 is then measured. The detection capacitor C1 is then discharged for the subsequent measurement.

In the V0 measurement period, voltage corresponding to voltage of the high-voltage battery 300 is measured. Thus, the switches S1 and S2 are turned on, the switches S3 and S4 are turned off, and the detection capacitor C1 is charged. That is, the high-voltage battery 300, a resistor R1, the detection capacitor C1, and a resistor R2 constitute the measurement path.

At the time of measurement of charge voltage of the detection capacitor C1, the switches S1 and S2 are turned off, the switches S3 and S4 are turned on, the switch Sa is turned on, and sampling is performed in a control device 420. Thereafter, the detection capacitor C1 is discharged for the subsequent measurement. Operations at the time of measurement of charge voltage of the detection capacitor C1 and at the time of discharge of the detection capacitor C1 are similar in the other measurement periods.

In the Vc1$n$ measurement period, voltage on which an influence of the insulation resistance RLn is reflected is measured. Thus, the switches S1 and S4 are turned on, the switches S2 and S3 are turned off, and the detection capacitor C1 is charged. That is, the high-voltage battery 300, the resistor R1, the detection capacitor C1, a resistor R4, a ground, and the insulation resistor RLn constitute the measurement path.

In the Vc1$p$ measurement period, voltage on which an influence of the insulation resistance RLp is reflected is measured. Thus, the switches S2 and S3 are turned on, the switches S1 and S4 are turned off, and the detection capacitor C1 is charged. That is, the high-voltage battery 300, the insulation resistor RLp, the ground, a resistor R5, the detection capacitor C1, and the resistor R2 constitute the measurement path.

It is known that, $(RLp \times RLn)/(RLp+RLn)$ can be derived based on $(Vc1p+Vc1n)/V0$ calculated from V0, Vc1$n$, and Vc1$p$ obtained in these measurement periods. Thus, the control device 420 of the ground fault detection apparatus 400 can figure out the combined resistance of the insulation resistances RLp and RLn by measuring V0, Vc1$n$, and Vc1$p$. If the combined resistance of the insulation resistances RLp and RLn is equal to or less than a predetermined determination reference level, then the control device 420 determines that a ground fault is generated and outputs a warning.

Meanwhile, in each of the measurement periods, if the detection capacitor C1 is fully charged, then a voltage value of the high-voltage battery 300 is obtained in the V0 measurement period, and values obtained by dividing the high-voltage battery 300 by the insulation resistance RLp, RLn are just derived in the Vc1$n$ measurement period and the Vc1$p$ measurement period. The insulation resistance cannot be calculated by the above equation. For this reason, charge time in each of the measurement periods is set to be the time by which the detection capacitor C1 is charged for about 50%, for example.

Patent Literature 1: JP 2015-206784 A

SUMMARY OF THE INVENTION

In general, capacitors CYp and CYn, each called a Y capacitor (line bypass capacitor), are connected between a positive-electrode-side power supply line 301 of the high-voltage battery 300 and a ground electrode, and between a negative-electrode-side power supply line 302 and the ground electrode, to eliminate radio-frequency noise of the power supply and to stabilize the operation. Particularly, if the high-voltage battery 300 is to be connected to a high-voltage facility such as a charging facility, then the high-capacity Y capacitors are connected.

If the high-capacity Y capacitors are connected, then when each time measurement is performed in the ground fault detection apparatus 400, electric charge accumulated in the Y capacitors will move to the detection capacitor C1, having an influence on a measurement value. If the capacity of the detection capacitor C1 is increased to alleviate such influence, then the charging speed will correspondingly be lowered, and the measurement time will correspondingly be extended.

An object of the present invention is to provide a ground fault detection apparatus which deals with a high-capacity Y capacitor.

The present invention provides a ground fault detection apparatus connected to a high-voltage battery and configured to detect lowering of insulation resistance of a system provided with the high-voltage battery, the apparatus includes: a detection capacitor which operates as a flying capacitor; a control unit configured to measure fully charged voltage of the detection capacitor; a first switch and a first resistor configured to connect a positive electrode side of the high-voltage battery to a positive-electrode-side end of the detection capacitor in series; a second switch and a second resistor configured to connect a negative electrode side of the high-voltage battery to a negative-electrode-side end of the detection capacitor in series; a third switch configured to connect the positive-electrode-side end of the detection capacitor to a ground; a fourth switch configured to connect the negative-electrode-side end of the detection capacitor to the ground; a positive-electrode-side termination resistor configured to connect the positive electrode side of the high-voltage battery to the ground; and a negative-electrode-side termination resistor configured to connect the negative electrode side of the high-voltage battery to the ground, wherein the control unit is configured to: compare a first charge voltage (Vp) of the detection capacitor measured with the first switch and the fourth switch turned on with a second charge voltage (Vn) of the detection capacitor measured with the second switch and the third switch turned on; and, if the first charge voltage (Vp) is smaller and when degree of the smallness of the first charge voltage (Vp) is greater than a predetermined reference, then determine that the positive-electrode-side insulation resistance is lowered, and if the second charge voltage (Vn) is smaller and when degree of the smallness of the second charge voltage (Vn) is greater than a predetermined reference, determine that the negative-electrode-side insulation resistance is lowered. The control unit is configured to, if the degree of the smallness of the first charge voltage (Vp) or the second charge voltage (Vn), whichever is smaller, is not greater than the predetermined reference, measure a third charge voltage (Vpp) of the detection capacitor with the first switch, the fourth switch and the second switch turned on, or, measure a fourth charge voltage (Vnn) of the detection capacitor with the second switch, the third switch and the first switch are turned on; and, if a ratio of change from the first charge voltage (Vp) to the third charge voltage (Vpp) is smaller than a reference, or if a ratio of change from the second charge voltage (Vn) to the fourth charge voltage (Vnn) is smaller than a reference, determine that the insulation resistance is lowered on both the electrodes.

Further, the control unit is configured to, if the degree of smallness of the first charge voltage (Vp) or the second charge voltage (Vn), whichever is smaller, is not greater than the predetermined reference, measure the third charge voltage (Vpp) when the first charge voltage (Vp) is smaller, or measure the fourth charge voltage (Vnn) when the second charge voltage (Vn) is smaller.

According to the present invention, a ground fault detection apparatus which deals with a high-capacity Y capacitor is provided.

DETAILED DESCRIPTION OF EXEMPLARY EMBODIMENT OF THE INVENTION

Figure 1:
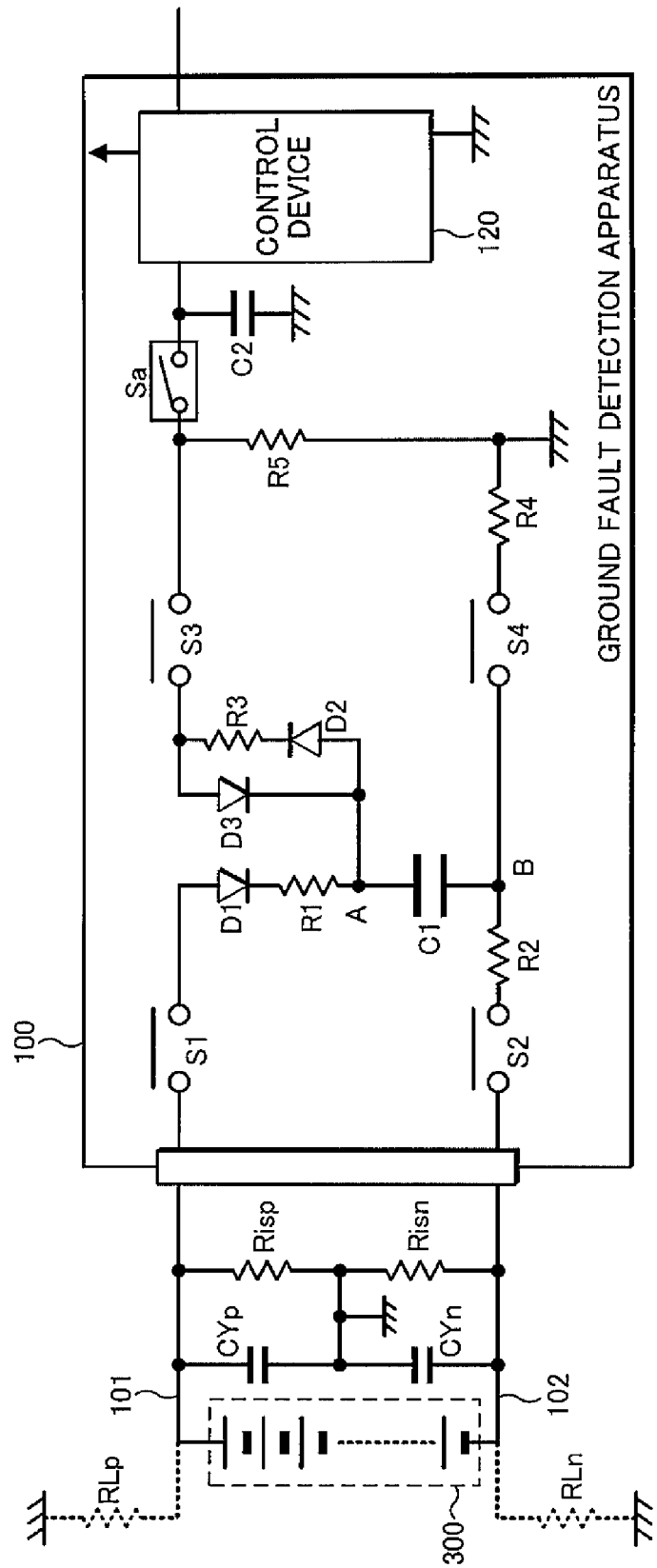
FIG. 1 is a block diagram illustrating a configuration of a ground fault detection apparatus according to an embodiment of the present invention.

An embodiment of the present invention will be described in detail with reference to the drawings. FIG. 1 is a block diagram illustrating a configuration of a ground fault detection apparatus 100 according to an embodiment of the present invention. As illustrated in FIG. 1, the ground fault detection apparatus 100 is an apparatus of a flying capacitor type connected to a high-voltage battery 300 to detect a ground fault of a system provided with the high-voltage battery 300. In this apparatus, insulation resistance between a positive electrode side of the high-voltage battery 300 and a ground is referred to as RLp, and insulation resistance between a negative electrode side and the ground is referred to as RLn.

The high-voltage battery 300 is a battery used to drive a vehicle and cause the vehicle to travel. The high-voltage battery 300 is constituted of a chargeable battery such as a lithium ion battery, and is configured to discharge via a not-illustrated bus bar and to drive an electric motor connected via an inverter or the like. Also, at the time of regeneration or connection to a charging facility, charging is performed via the bus bar.

In general, capacitors CYp and CYn each so-called as a Y capacitor (line bypass capacitor) are connected between a positive-electrode-side power supply line 101 of the high-voltage battery 300 and a ground electrode and between a negative-electrode-side power supply line 102 and the ground electrode, respectively, to eliminate radio-frequency noise of the power supply and stabilize the operation.

As illustrated in FIG. 1, the ground fault detection apparatus 100 includes a detection capacitor C1 which operates as a flying capacitor and a control device 120. A positive-electrode-side end of the detection capacitor C1 is connected to a connection point A, and a negative-electrode-side end thereof is connected to a connection point B.

The ground fault detection apparatus 100 also includes four switches S1 to S4 around the detection capacitor C1 to switch a measurement path and to control charge/discharge of the detection capacitor C1. The ground fault detection apparatus 100 further includes a switch Sa configured to sample voltage for measurement corresponding to a charge voltage of the detection capacitor C1. The switch Sa is turned on only at the time of the sampling. Each of these switches can be an insulating switching element such as a photo MOSFET.

One end of the switch S1 is connected to the positive-electrode-side power supply line 101, while the other end thereof is connected to an anode side of a diode D1. A cathode side of the diode D1 is connected to one end of a resistor R1, and the other end of the resistor R1 is connected to the connection point A.

One end of the switch S2 is connected to the negative-electrode-side power supply line 102, while the other end thereof is connected to one end of a resistor R2. The other end of the resistor R2 is connected to the connection point B.

One end of the switch S3 is connected to one end of a resistor R3 and an anode side of a diode D3, while the other end thereof is connected to one end of a resistor R5 and one end of the switch Sa. A cathode side of the diode D3 is connected to the connection point A, the other end of the resistor R3 is connected to a cathode side of a diode D2, and an anode side of the diode D2 is connected to the connection point A. The other end of the resistor R5 is grounded.

One end of the switch S4 is connected to the connection point B, while the other end thereof is connected to one end of a resistor R4. The other end of the resistor R4 is grounded. The other end of the switch Sa is connected to one end of a capacitor C2 and to an analog input terminal of the control device 120. The other end of the capacitor C2 is grounded.

The control device 120 is a microcomputer or the like that executes a program installed in advance to execute various control operations required in the ground fault detection apparatus 100. Specifically, the control device 120 controls the switches S1 to S4 individually to switch the measurement path and controls charge and discharge of the detection capacitor C1.

Also, the control device 120 controls the switch Sa, inputs an analog level corresponding to the charge voltage of the detection capacitor C1 from the analog input terminal, and, based on this analog level, detects lowering of insulation resistance of the system provided with the high-voltage battery 300.

In addition, in the present embodiment, a positive-electrode-side termination resistor Risp is connected between the positive-electrode-side power supply line 101 and the ground, and a negative-electrode-side termination resistor Risn is connected between the negative-electrode-side power supply line 102 and the ground. The positive-electrode-side termination resistor Risp and the negative-electrode-side termination resistor Risn have the same resistance values, and each of the resistance values is sufficiently higher than an insulation resistance value determined as a ground fault.

Also, in the present embodiment, the detection capacitor C1 is measured in a fully charged state. Even if the high-capacity Y capacitors (CYp and CYn) are to be connected, the detection capacitor C1 does not need to have a high capacity, and thus full-charge time for the measurement can be shortened. Also, as described below, since voltage values of the high-voltage battery 300 divided by resistors are measured, one does not need to wait until the Y capacitors are stabilized.

Figure 2:
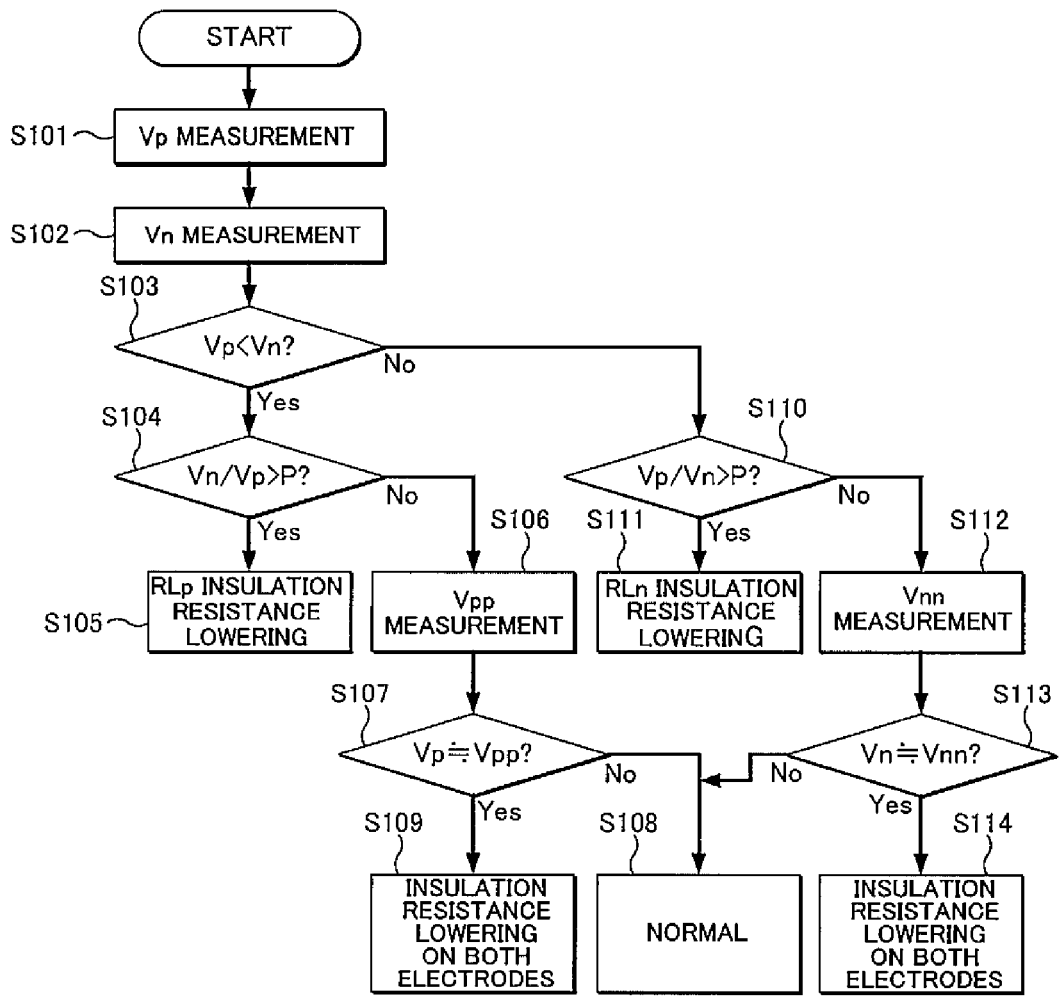
FIG. 2 is a flowchart illustrating an operation of the ground fault detection apparatus.

Next, an operation of the ground fault detection apparatus 100 configured as described above will be described with reference to the flowchart in FIG. 2. As described above, in the present embodiment, the measurement is performed in a state in which the detection capacitor C1 is fully charged. Thus, a ground fault determination is performed in a different method from a conventional insulation resistance calculation method.

Figure 3A:
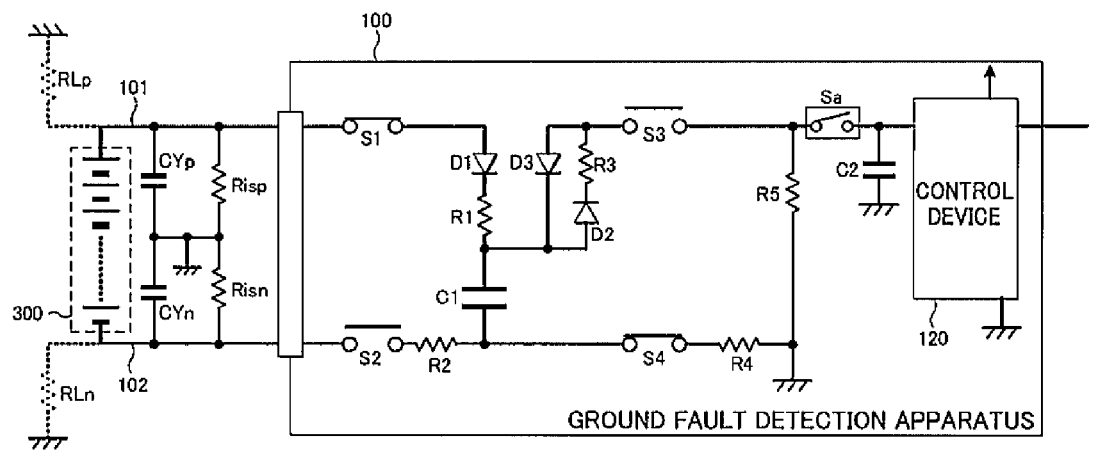
FIGS. 3A and 3B illustrate Vp measurement.

First, as illustrated in FIG. 3A, the detection capacitor C1 is fully charged while the switches S1 and S4 are turned on and the switches S2 and S3 are turned off, and charge voltage Vp at this time is measured (S101).

Figure 3B:
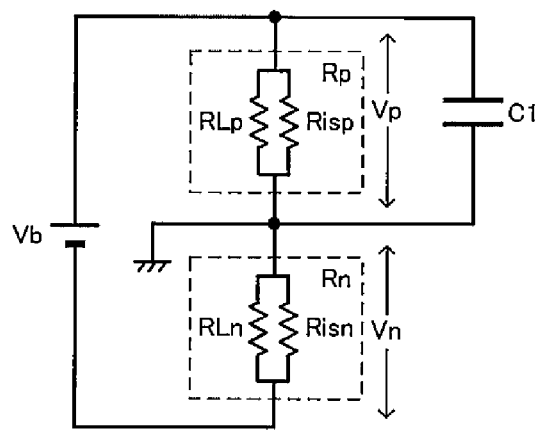

Here, as illustrated in FIG. 3B, the charge voltage Vp corresponds to voltage generated in a resistor Rp when voltage Vb of the high-voltage battery 300 is divided by the resistor Rp and a resistor Rn. Here, the resistance Rp is parallel combined resistance of the positive-electrode-side termination resistance Risp and the positive-electrode-side insulation resistance RLp, and the resistance Rn is parallel combined resistance of the negative-electrode-side termination resistance Risn and the negative-electrode-side insulation resistance RLn.

Figure 4A:
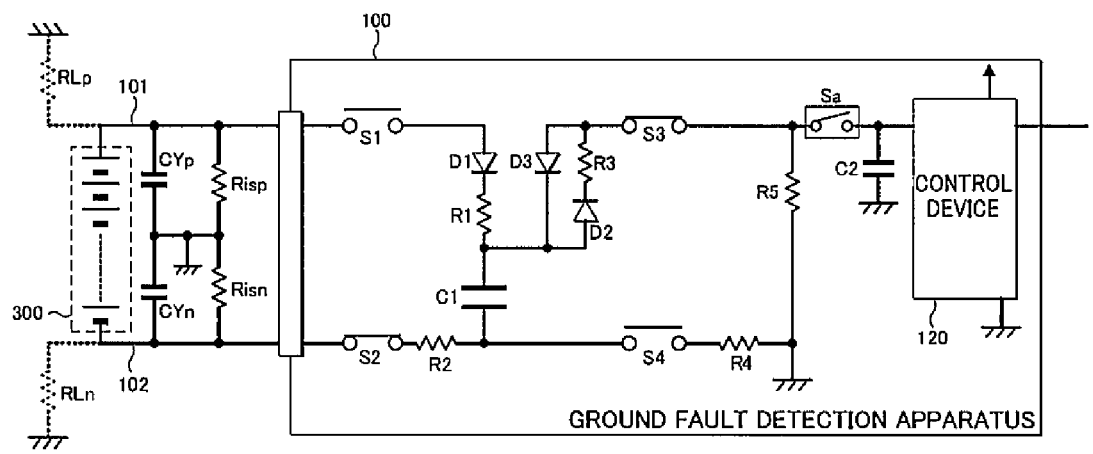
FIGS. 4A and 4B illustrate Vn measurement.

Subsequently, as illustrated in FIG. 4A, the detection capacitor C1 is fully charged while the switches S1 and S4 are turned off and the switches S2 and S3 are turned on, and charge voltage Vn at this time is measured (S102).

Figure 4B:
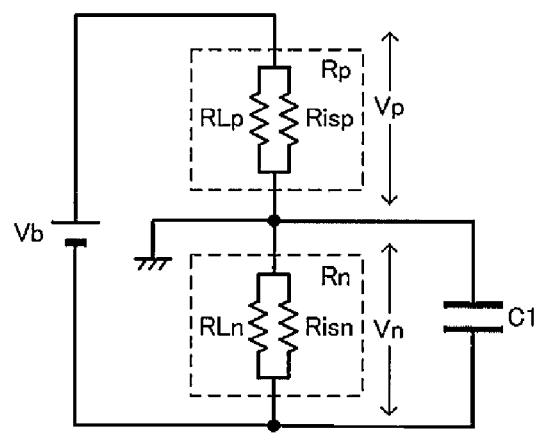

Here, as illustrated in FIG. 4B, the charge voltage Vn corresponds to voltage generated in the resistor Rn when the voltage Vb of the high-voltage battery 300 is divided by the resistor Rp and the resistor Rn. The order of measurement of the charge voltage Vn and the charge voltage Vp may be selected arbitrarily.

If the charge voltage Vp is smaller than the charge voltage Vn (S103: Yes), and if the degree of this smallness is greater than a predetermined reference, e.g., when Vn/Vp>reference value P (S104: Yes), then it is determined that the positive-electrode-side insulation resistance RLp is lowered (S105).

The supportable reason is described below. That is, since the positive-electrode-side termination resistance Risp and the negative-electrode-side termination resistance Risn are the same resistance values, if the charge voltage Vp is smaller than the charge voltage Vn, this means that the positive-electrode-side insulation resistance RLp is smaller than the negative-electrode-side insulation resistance RLn, and, as the degree of this smallness greater, the positive-electrode-side insulation resistance RLp is deemed to be more lowered.

Similarly, if the charge voltage Vn is smaller than the charge voltage Vp (S103: No), and if the degree of this smallness is greater than a predetermined reference, e.g., Vp/Vn>reference value P (S110: Yes), then it is determined that the negative-electrode-side insulation resistance RLn is lowered (S111).

Figure 5A:
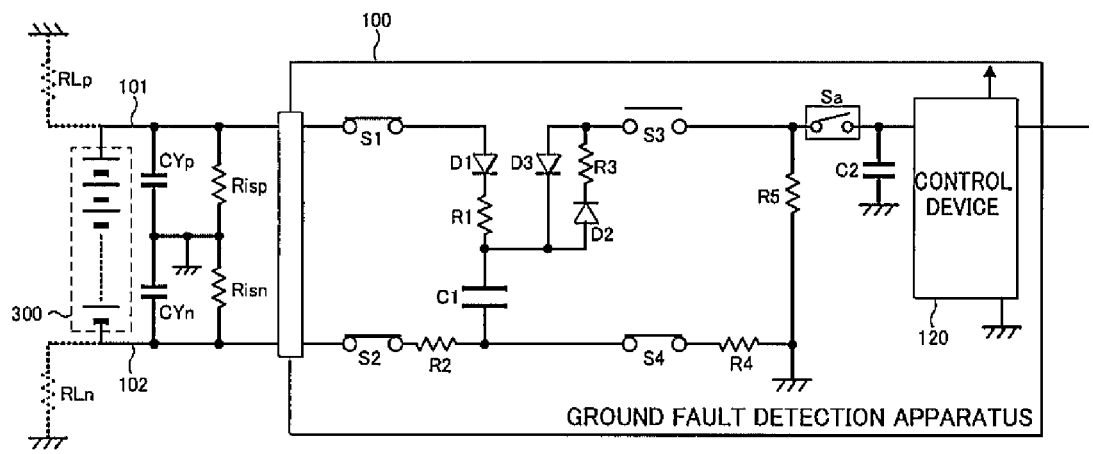
FIGS. 5A and 5B illustrate Vpp measurement.

If the difference between the charge voltage Vp and the charge voltage Vn is relatively small, it is possible, although the possibility is small, that the positive-electrode-side insulation resistance RLp and the negative-electrode-side insulation resistance RLn may be lowered with the same degree. Thus, when the charge voltage Vp is smaller than the charge voltage Vn (S103: Yes) and when the difference between the charge voltage Vp and the charge voltage Vn is relatively small, such as a case of Vn/Vp≤reference value P (S104: No), the detection capacitor C1 is fully charged with the switches S1, S4, and S2 are turned on and the switch S3 is turned off, as illustrated in FIG. 5A, and charge voltage Vpp at this time is measured (S106).

Figure 5B:
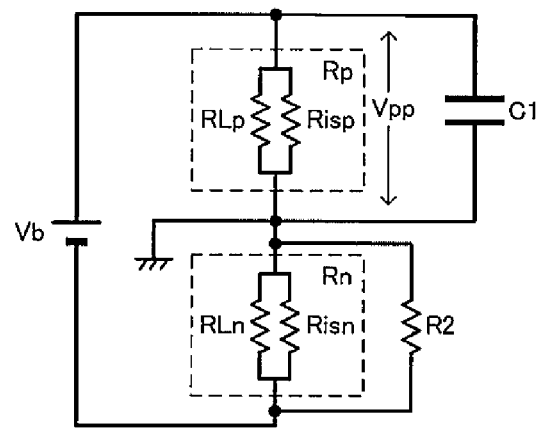

Here, as illustrated in FIG. 5B, the charge voltage Vpp corresponds to voltage generated in the resistor Rp when voltage Vb of the high-voltage battery 300 is divided by the resistor Rp and a parallel combined resistor of the resistor Rn and the resistor R2. The resistor R2 has a sufficiently smaller value than an insulation resistance value determined as a ground fault.

Further, if the charge voltage Vp and the charge voltage Vpp are regarded as approximately equal values, such as a case in which a ratio of change (Vp/Vpp) at which the charge voltage Vp is changed to the charge voltage Vpp is smaller than the reference value (S107: Yes), meaning that an influence of the inserted resistor R2 is small, then it is determined that both the positive-electrode-side insulation resistance RLp and the negative-electrode-side insulation resistance RLn are lowered (S109).

On the other hand, if the charge voltage Vp and the charge voltage Vpp are not regarded as approximately equal values, such as a case in which the ratio of change at which the charge voltage Vp is changed to the charge voltage Vpp is greater than the reference value (S107: No), meaning that an influence of the inserted resistor R2 is great, then it is determined that neither the positive-electrode-side insulation resistance RLp nor the negative-electrode-side insulation resistance RLn is lowered, and that the state is normal (S108).

Figure 6A:
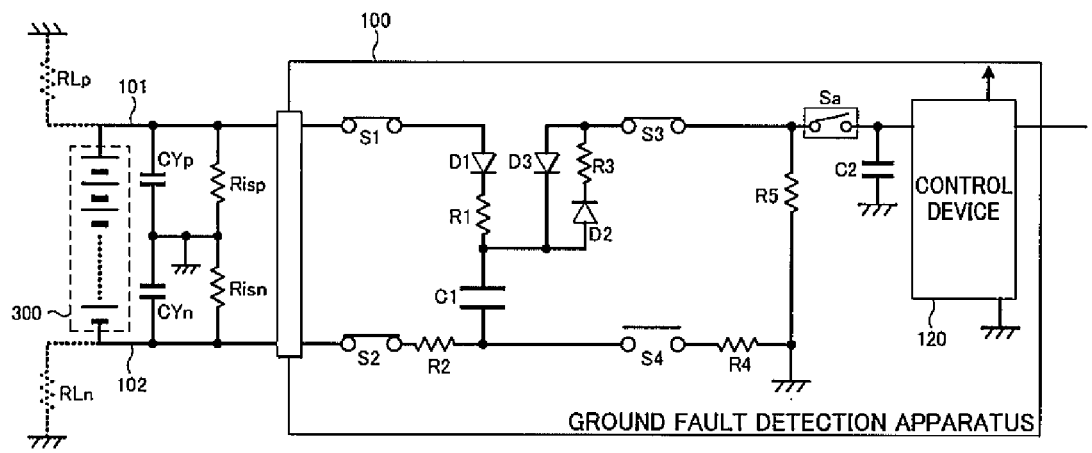
FIGS. 6A and 6B illustrate Vnn measurement.

Similarly, if the charge voltage Vn is smaller than the charge voltage Vp (S103: No), and if the difference between the charge voltage Vp and the charge voltage Vn is relatively small, such as a case of Vp/Vn≤reference value P (S110: No), then the detection capacitor C1 is fully charged with the switches S2, S3, and S1 are turned on and the switch S4 is turned off, as illustrated in FIG. 6A, and charge voltage Vnn at this time is measured (S112).

Figure 6B:
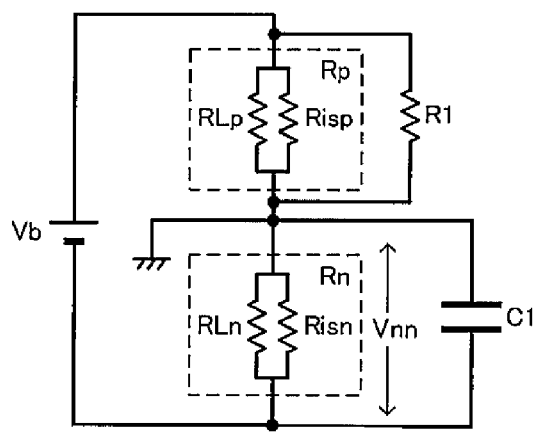
Figure 7:
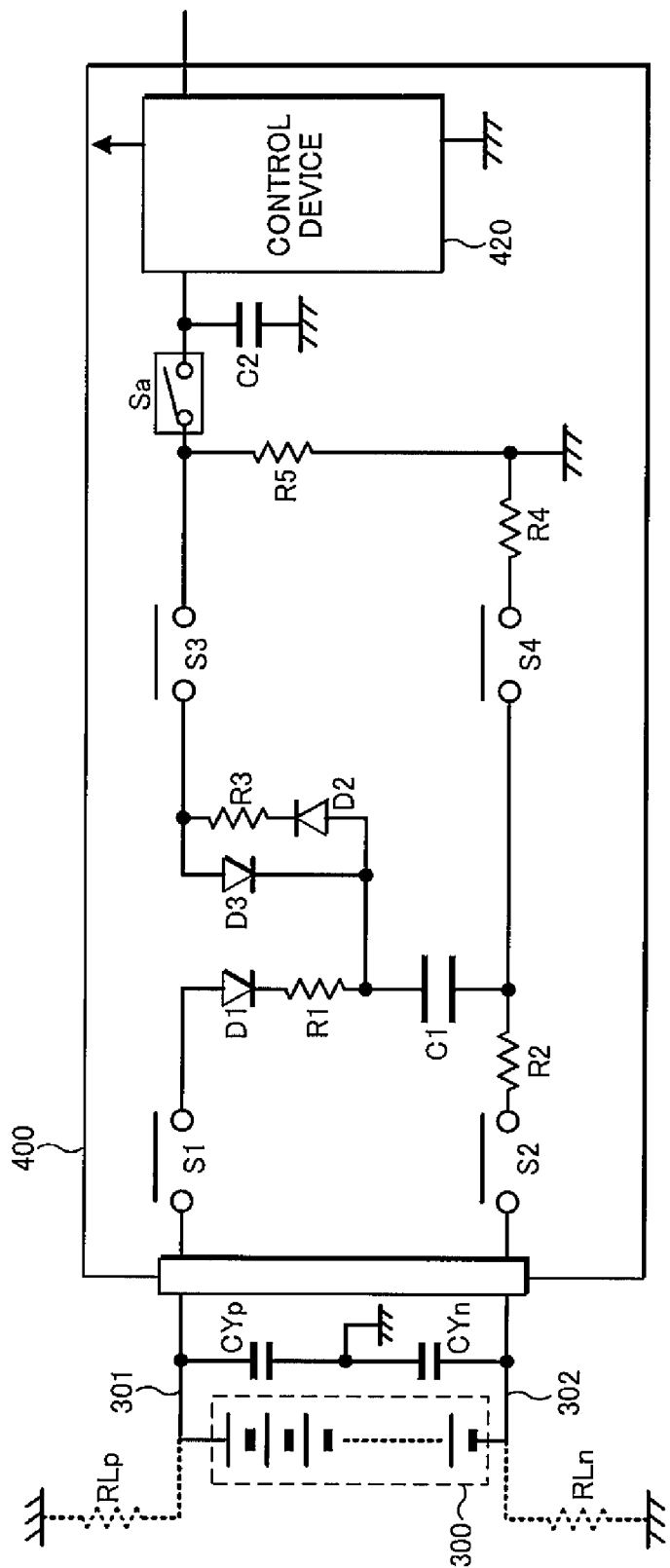
FIG. 7 illustrates an exemplary circuit of a conventional ground fault detection apparatus of a flying capacitor type.

Here, as illustrated in FIG. 6B, the charge voltage Vnn corresponds to voltage generated in the resistor Rn when voltage Vb of the high-voltage battery 300 is divided by a parallel combined resistor of the resistor Rp and the resistor R1 and the resistor Rn. The resistor R1 has a sufficiently smaller value than an insulation resistance value determined as a ground fault.

If the charge voltage Vn and the charge voltage Vnn are regarded as approximately equal values, such as a case in which a ratio of change (Vn/Vnn) at which the charge voltage Vn is changed to the charge voltage Vnn is smaller than the reference value (S113: Yes), meaning that an influence of the inserted resistor R1 is small, then it is determined that both the positive-electrode-side insulation resistance RLp and the negative-electrode-side insulation resistance RLn are lowered (S114).

On the other hand, if the charge voltage Vn and the charge voltage Vnn are not regarded as approximately equal values, such as a case in which the ratio of change at which the charge voltage Vn is changed to the charge voltage Vnn is greater than the reference value (S113: No), meaning that an influence of the inserted resistor R1 is great, then it is determined that neither the positive-electrode-side insulation resistance RLp nor the negative-electrode-side insulation resistance RLn is lowered, and that the state is normal (S108).

In the above example, when the difference between the charge voltage Vp and the charge voltage Vn is relatively small, the charge voltage Vpp is measured if the charge voltage Vp is smaller, and the charge voltage Vnn is measured if the charge voltage Vn is smaller. The reason for this is to determine the ratio of change of the charge voltage when the resistor R2 or the resistor R1 is connected in parallel with the positive-electrode-side insulation resistance RLp or the negative-electrode-side insulation resistance RLn, whichever is greater. However, if the relative difference is small regardless of the great/small relationship between the charge voltage Vp and the charge voltage Vn, then either the charge voltage Vpp or the charge voltage Vnn may be measured to make the determination of the insulation lowering on both electrodes or the normal state.

REFERENCE SIGNS LIST 100 ground fault detection apparatus
101 positive-electrode-side power supply line
102 negative-electrode-side power supply line
120 control device
300 high-voltage battery
C1 detection capacitor
CYp Y capacitor
CYn Y capacitor
RLn negative-electrode-side insulation resistance
RLp positive-electrode-side insulation resistance
Risn negative-electrode-side termination resistance
Risp positive-electrode-side termination resistance

What is claimed is:

1. A ground fault detection apparatus connected to a high-voltage battery and configured to detect lowering of insulation resistance of a system provided with the high-voltage battery, the apparatus comprising:
    a detection capacitor which operates as a flying capacitor;
    a control unit configured to measure fully charged voltage of the detection capacitor;
    a first switch and a first resistor configured to connect a positive electrode side of the high-voltage battery to a positive-electrode-side end of the detection capacitor in series;
    a second switch and a second resistor configured to connect a negative electrode side of the high-voltage battery to a negative-electrode-side end of the detection capacitor in series;
    a third switch configured to connect the positive-electrode-side end of the detection capacitor to a ground;
    a fourth switch configured to connect the negative-electrode-side end of the detection capacitor to the ground;
    a positive-electrode-side termination resistor configured to connect the positive electrode side of the high-voltage battery to the ground; and
    a negative-electrode-side termination resistor configured to connect the negative electrode side of the high-voltage battery to the ground,
    wherein the control unit is configured to:
    compare a first charge voltage (Vp) of the detection capacitor, which is measured with the first switch and the fourth switch turned on, with a second charge voltage (Vn) of the detection capacitor, which is measured with the second switch and the third switch turned on; and,
    if the first charge voltage (Vp) is smaller and when degree of the smallness of the first charge voltage (Vp) is greater than a predetermined reference, then determine that the positive-electrode-side insulation resistance is lowered, and if the second charge voltage (Vn) is smaller and when degree of the smallness of the second charge voltage (Vn) is greater than a predetermined reference, determine that the negative-electrode-side insulation resistance is lowered.

2. The ground fault detection apparatus according to claim 1, wherein the control unit is configured to:
    if the degree of the smallness of the first charge voltage (Vp) or the second charge voltage (Vn), whichever is smaller, is not greater than the predetermined reference, measure a third charge voltage (Vpp) of the detection capacitor with the first switch, the fourth switch and the second switch turned on, or, measure a fourth charge voltage (Vnn) of the detection capacitor with the second switch, the third switch and the first switch turned on; and,
    if a ratio of change from the first charge voltage (Vp) to the third charge voltage (Vpp) is smaller than a reference or if a ratio of change from the second charge voltage (Vn) to the fourth charge voltage (Vnn) is smaller than a reference, determine that the insulation resistance is lowered on both the electrodes.

3. The ground fault detection apparatus according to claim 2, wherein the control unit is configured to
    if the degree of smallness of the first charge voltage (Vp) or the second charge voltage (Vn), whichever is smaller, is not greater than the predetermined reference, measure the third charge voltage (Vpp) when the first charge voltage (Vp) is smaller, or measure the fourth charge voltage (Vnn) when the second charge voltage (Vn) is smaller.

* * * * *